_ _

United States Patent [19]
Britsch

[11] Patent Number: 5,913,267
[45] Date of Patent: Jun. 22, 1999

[54] PROCESS AND DEVICE FOR ADAPTING THE POSITION OF PRINTING PLATES TO THE DEFORMATION OF THE PAPER TO BE PRINTED

[75] Inventor: Helmut Britsch, Friesenheim, Germany

[73] Assignee: Brüder Neumeister GmbH, Lahr, Germany

[21] Appl. No.: 08/945,894

[22] PCT Filed: Apr. 18, 1996

[86] PCT No.: PCT/EP96/01620

§ 371 Date: Nov. 4, 1997

§ 102(e) Date: Nov. 4, 1997

[87] PCT Pub. No.: WO96/35147

PCT Pub. Date: Nov. 7, 1996

[30] Foreign Application Priority Data

May 4, 1995 [DE] Germany .......................... 195 16 368

[51] Int. Cl.[6] ................................................ B41C 1/00
[52] U.S. Cl. ............... 101/401.1; 101/486; 101/DIG. 36
[58] Field of Search ..................................... 101/375, 378, 101/382, 382.1, 383, 415.1, DIG. 36, 401.1, 486

[56] References Cited

U.S. PATENT DOCUMENTS

| | | | |
|---|---|---|---|
| 4,705,590 | 11/1987 | Vandenberg | 101/415.1 |
| 4,833,985 | 5/1989 | Kojima et al. | 101/DIG. 36 |
| 4,872,407 | 10/1989 | Banke | 101/DIG. 36 |
| 5,065,677 | 11/1991 | Leader, Jr. | 101/415.1 |
| 5,117,365 | 5/1992 | Jeschke et al. | 101/DIG. 36 |
| 5,272,980 | 12/1993 | Takeuchi et al. | 101/DIG. 36 |
| 5,377,590 | 1/1995 | Bolza-Schiinemann et al. | 101/382.1 |
| 5,500,801 | 3/1996 | Loffler | 101/DIG. 36 |
| 5,806,431 | 9/1998 | Muth | 101/415.1 |

FOREIGN PATENT DOCUMENTS

| | | |
|---|---|---|
| 0 229 892 A2 | 7/1987 | European Pat. Off. . |
| 1310834 | 10/1962 | France . |
| 20 45 953 B2 | 4/1978 | Germany . |
| 33 41 924 A1 | 5/1985 | Germany . |
| 36 33 855 C2 | 7/1988 | Germany . |
| 37 34 242 A1 | 4/1989 | Germany . |
| 39 05 093 A1 | 9/1990 | Germany . |
| 36 14 578 C2 | 1/1991 | Germany . |

*Primary Examiner*—Ren Yan
*Attorney, Agent, or Firm*—Panitch Schwarze Jacobs & Nadel, P.C.

[57] ABSTRACT

In a process and a device for adapting the position of printing plates (4) to the deformation (fan-out) of the paper web (2) to be printed through damp, ink absorption and mechanical stress on passing between several successive pairs of printing rolls (1) and also for adaptation to deformations possibly occuring in the fixing device of a printing roll (1) and resultant changes in the position of a printing plate (4), the printing plate (4) and/or the mount holding it in the stamping or bending machine (5) is moved or shifted laterally, in the circumferential direction and/or angularly by the amount required for said printing plate (4) on the printing roll (1) owing to said deformation of the paper web (2) to be printed, in order to obtain a print corresponding with a preceding printing roll (1), as considered in the direction of feed of the paper web, despite the paper deformation that has meanwhile occured. Thereafter the deformations, i.e. bends and/or stampings (7) are applied to said printing plate (4) moved from its zero position. For this purpose in particular a computer-controlled positioning device (17) is used in the bending and/or stamping machine (5) after the corresponding data on the paper web, the printing machine and the type of production have been fed into the computer.

6 Claims, 5 Drawing Sheets

PROCESS AND DEVICE FOR ADAPTING THE POSITION OF PRINTING PLATES TO THE DEFORMATION OF THE PAPER TO BE PRINTED

BACKGROUND OF THE INVENTION

The invention relates to a process for adapting the position of printing plates to the deformation (fan-out) of the paper to be printed through mositure and ink absorption on passing between several successive pairs of printing rolls and/or for adaptation to deformations occuring at the fixing device of a printing roll and resultant changes in the position of a printing plate, whereby when the printing plate is produced it is provided with marks for positionally accurate stamping and/or bending and is inserted therewith into a stamping and/or bending machine and is adjusted and aligned therein according to the marks.

The invention also relates to a device for carrying out this process with a stamping and/or bending machine for applying the stamping for the register pins of printing rolls on printing plates and/or for bending for mounting the respective printing plate on the printing roll.

It is known from EP-A-0 229 892 that, particularly in color printing, as the the paper to be printed passes through several pairs of printing rolls it increases or possibly even decreases in its width oriented crosswise to the feed, depending on how much moisture is thereby absorbed and on what structure the paper has. Among experts this phenomenon is called "fan-out".

Particularly when producing color prints, one color may as a result become displaced relative to another one or relative to the printing area proper, which leads to a muddy and unsatisfactory print and is accepted at best for cheap printed works.

For remedy the EP-A-0 229 892 describes that such dimensional changes occuring in the paper web be corrected by adjusting the register pins for the printing plates on the printing rolls, i.e. in a structurally complex manner the register pins must be provided so as also to be adjustable. In the course of a great number of specimen prints, the printer has to adjust the register pins in such a way that for the respective grade of paper the paper web error occuring is corrected for the printing to be carried out.

If, however, a different grade of paper is then printed with the same printing machine, the correction has to be repeated because this other paper has a different fan-out. This is not only time-consuming and difficult, requiring very great experience, but is nevertheless still fraught with errors.

SUMMARY OF THE INVENTION

The object underlying the invention is therefore to provide a process and device of the kind set forth at the outset, permitting dimensional changes of paper webs to be allowed for in a simpler fashion, so that less time is lost in changing from one paper web to the other at the printing machine and less misprints are necessary, but nevertheless a good printing result can be attained even for multicolor printing.

To accomplish this apparently contradictory objective it is proposed in the process set forth at the outset that the printing plate and/or the mount holding it in the stamping and/or bending machine is moved laterally, in the circumferential direction and/or angularly by the amount required for said printing plate on the printing roll owing to the deformation of the paper to be printed, in order to obtain a print corresponding with a preceding printing to as considered in the direction of feed of the paper web, despite the paper deformation that has meanwhile occured and after which the deformations, i.e. bends and/or stampings, are applied to said printing plate moved from its zero position.

Hence the printing plate is provided with a seemingly incorrect bend and/or stamping, whereby this "error" corresponds to the dimensional discrepancy resulting from the paper deformation or fan-out. An adjustment of register pins is hence no longer necessary.

It is particularly expedient in this connection if the printing plate is aligned in the stamping and/or bending machine with the aid of at least one or two measuring devices, e.g. optoelectronic measuring devices, laser technology, infrared technology, sound wave- or ultrasonic wave technology, through chemical reactions, particularly with the aid of at least two video cameras, which measuring devices detect the marks, and that the printing plates are adjustable in such a way as to allow for the paper deformation to be expected. Hence initially the correct zero position of the printing plate in the stamping and/or bending machine can be set according to the mark previously accurately provided. Then the printing plates can be adjusted in such a way as is necessary to allow for paper deformations at the printing roll outside the exact mounting location proper, as can take place with the aid of the measuring devices and marks, and then the stampings and/or bends can be made so that the corresponding dimensional discrepancy is allowed for at the actual printing plate. If, by way of example, the printing plate has to be arranged on the printing roll somewhat further to the left, as viewed in the direction of feed, the stamping for the register pin is hence applied with the aid of the above-described procedure somewhat further to the right. This then has the result that when the printing plate is fitted into its mount on the printing roll, the desired slight displacement further to the left takes place.

An especially simple and expedient development of the process may consist in that for each location of one or more printing rolls, the paper deformation occuring there is empirically determined for the respective printing process and for the respective grade of paper and is fed into a computer in the stamping and/or bending machine, which computer controls the mount for the printing plate and, when called, suitably moves and adjusts the respective inserted printing plate before the deformations are applied thereto. Hence, for every determinate location of a printing plate on the printing roll, the paper error possibly occuring there can be empirically determined for different grades of paper and also for different printing inks and similar parameters and be fed into the computer. As a result, the user then only has to call up the corresponding values at the computer so as to align the respective printing plate in the stamping and/or bending machine, before the deformation allowing for the paper error is automatically applied to the printing plate.

A further development of the inventive process may consist in that dimensional changes brought about by deformations at the fixing device of a printing roll for printing plates are entered into the computer controlling the mount for the printing plate, so that the printing plate to be newly produced after such a deformation is bent and/or stamped in a fashion shifted or corrected by the extent of said deformation. Such deformations may occur, for example, if the paper web to be printed tears, and normally necessitate laborious manually underlaying of the printing plates in the region of the deformation then to be allowed for. By virtue of the process according to the invention this can hence also be dispensed with or simplified.

The device embodying the invention for carrying out the process, as set forth at the outset, is characterized in that a mount for the printing plate in the stamping and/or bending machine has a positioning device with which the printing plate is movable in the printing plate plane in one or in two directions at right angles to each other and in particular is rotatable, and that at least one or two measuring devices are provided for alignment and are preferably adjustable according to a paper deformation to be expected. By means of such a device it is possible for a printing plate to be fixed in the usual fashion in a stamping and/or bending machine on a mount, in order that it can be provided with the necessary deformations, i.e. bends or stampings for register pins or the like, whereby within the stamping and/or bending machine a paper error to be expected during printing can be allowed for in advance with the aid of a positioning device and the measuring device(s).

It is particularly advantageous if at least two video cameras are provided as measuring devices, because the technology for detecting and aligning by video cameras is highly developed and permits good accuracy.

The positioning device can have a rotary disc, a cross element, a turntable or the like, whose surface is arranged approximately flush with the support or support plate of the mount of the bending device in a recess or interspace of said support or support plate, and that said rotary disc is rotatable within the recess and in addition is adjustable in the horizontal direction in one or two directions at right angles to each other. By means of a simple mechanism of a rotatable disc, which can additionally be adjusted in the X and/or Y direction, the printing plate lying on it—by linkage of the control with the computer—can be adjusted with computer-control to paper errors, i.e. "fan-out", to be expected and empirically determined. As a result, from the outset the printing plate has the corresponding deformations which, as the printing plate is mounted on the printing roll, mean it is mounted displaced in accordance with the paper deformation.

BRIEF DESCRIPTION OF THE SEVERAL VIEWS OF THE DRAWINGS

An exemplary embodiment of the invention will be described in greater detail below with reference to the drawings in which, in schematic form.

DETAILED DESCRIPTION OF THE INVENTION

Figure 1:
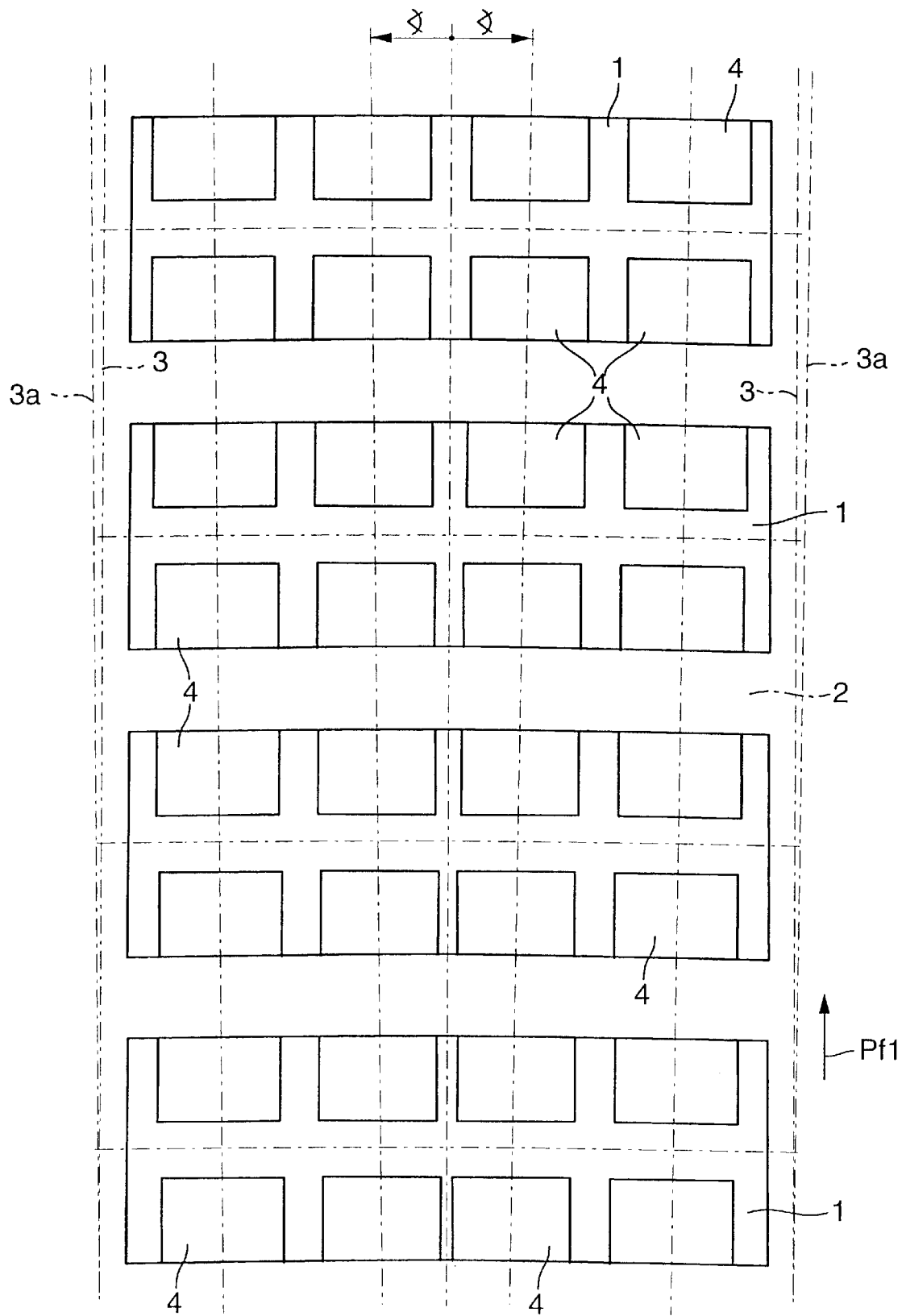
FIG. 1 is a view of altogether four printing rolls arranged one after the other in the direction of feed, each bearing eight printing plates, whereby the paper web to be printed and particularly its side edges at the left and right of the end faces of these printing rolls are represented in dot-dash lines, whereby the lines extending parallel to one another indicate an ideal paper web, while the lines diverging outwardly therefrom from bottom to top represent the paper deformation during passage between printing rolls from bottom to top.

Of the four pairs of printing rolls provided in the exemplary embodiment of a printing machine, FIG. 1 depicts in each case only one printing roll 1, whereby the opposing roll can be either above or behind the drawing plane. The direction of feed of a paper web 2 to be printed is from bottom to top in FIG. 1, according to arrow Pf1. Dot-dash lines 3 represent the lateral limits of the paper web 2. The parallel lines 3 correspond to a normal paper web subject to no deformation whatsoever, whereas the lines 3a running slantwise away from each other or diverging in the direction of feed belong to a paper web 2 which was deformed by the printing process and by the damp thereby also absorbed by the paper. Therefore the difference between lines 3 and 3a displays the fan-out of this paper web 2 in schematic form.

Eight printing plates 4 are indicated on each of the printing rolls 1, whereby a specific location is allocated to each printing plate 4 on the printing roll 1. To allow for the divergence or fan-out of the paper web 2 as it passes between the printing rolls 1 and as it is printed with different colors, particularly the printing plates 4 on the last roll in the direction of feed have to be offset laterally and possibly also in the circumferential direction of the printing roll 1, as opposed to the position depicted there. This is so, in order that this last printing plate is also accurately applied to the location to be printed, which has drifted somewhat with the deformation of the paper web. It is hence important that the deformations provided on such printing plates 4, namely the peripheral bends for attachment to corresponding mounts of the printing rolls 1 and stampings for their adjustment with the aid of register pins provided on the printing rolls 1, are applied to the printing plates 4 in such a way as to automatically allow for the paper deformation.

Figure 2:
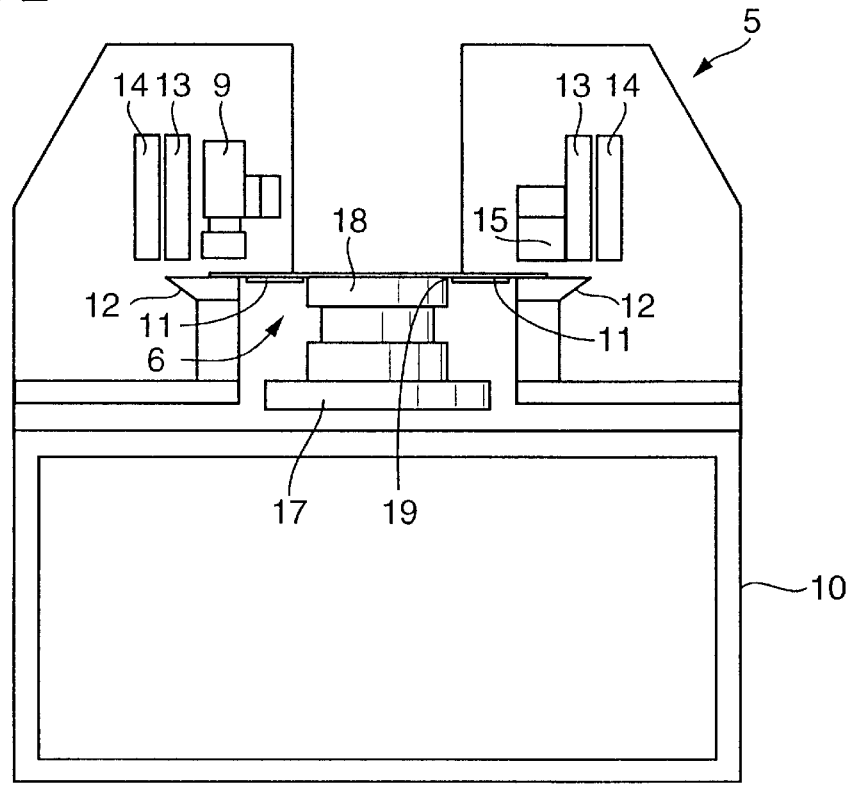
FIG. 2 is a side view and FIG. 3 is a plan view of a stamping and/or bending machine in which the printing plates to be mounted on the printing rolls are provided with deformations, namely peripheral bends for their mounting and stampings for exact adjustment on the register pins of the printing rolls.
Figure 3:
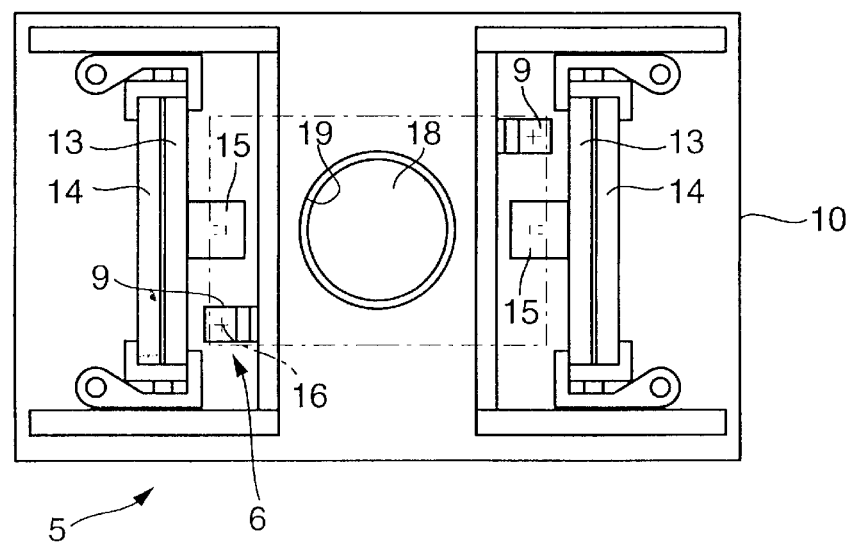

This is achieved in that the respective printing plate 4 and/or a mount 6 holding it in the stamping and/or bending machine 5 depicted in FIGS. 2 and 3 is moved laterally, in the circumferential direction of the printing rolls 1 and/or angularly by the amount required for said printing plate 4 on the printing roll 1 owing to the described deformation of the paper web 2 to be printed, in order to obtain a print corresponding with a preceding printing roll 1, as considered in the direction of feed of the paper web, despite the paper deformation that has meanwhile occured. Thereafter the deformations, i.e. bends and/or stampings 7, are applied to said printing plate 4 moved from its zero position proper. FIGS. 4 to 7 indicate in schematic form how a printing plate 4 can be provided with stampings 7 corresponding exactly to a zero position, that is to say, this printing plate 4 is suited for the first printing roll 1 in the position of feed, as is depicted lowermost in FIG. 1.

Figure 4:
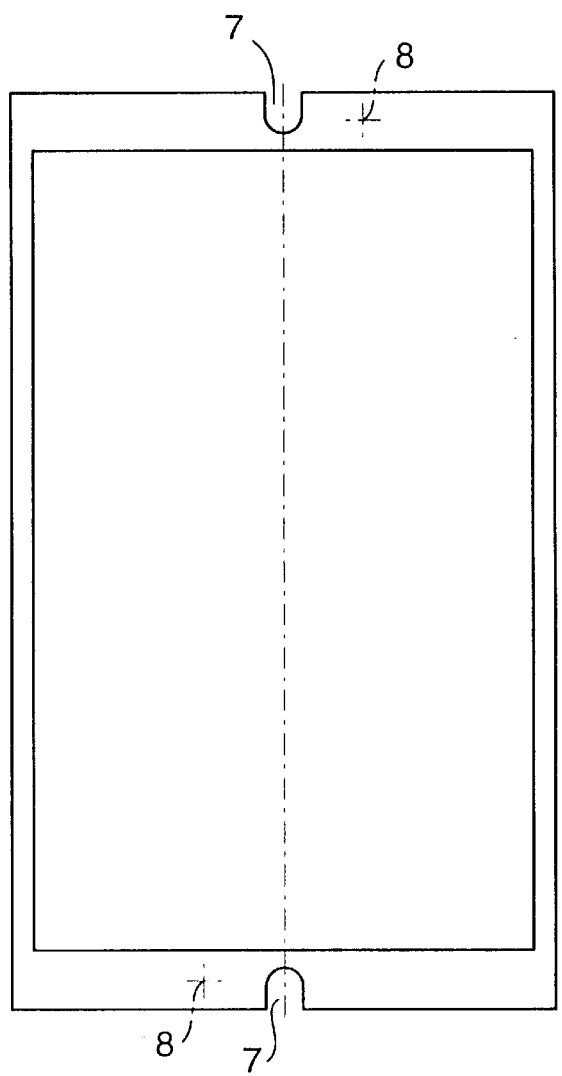
FIG. 4 is a printing plate which at its two opposed edges is provided with stampings for register pins, whereby adjacent to said stampings there are marks shown which were applied before the deformation of the printing plate and serve for accurately aligning the printing plate in the stamping and/or bending machine with the aid of video cameras.
Figure 5:
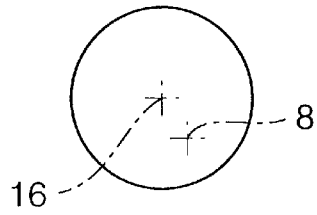
FIG. 5 is the field of view of such a video camera before the mark and thereby the printing plate is positionally correctly aligned.

Before being deformed, this printing plate 4 is placed in the stamping and/or bending machine 5 and pre-aligned. Near the edges to be stamped, the printing plate has marks 8 which can be detected with the aid of two video cameras 9. FIG. 5 shows show the corresponding mark 16 in the video camera 9 can be arranged centrally, but the mark 8 of the printing plate 4 can still be unadjusted when the printing plate 4 is preadjusted in the stamping and/or bending machine 5. According to FIG. 6 the printing plate 4 can then be moved in two different directions or turned so as to bring its mark 8 into coincidence with that of the video camera according to FIG. 7. If the respective deformation is now carried out at the stamping and/or bending machine, the positionally accurate stampings 7 are formed in the printing plate 4, as represented in FIG. 4.

Instead of the video camera, other measuring devices could also be provided, particularly optoelectronic measuring devices or ones based on laser technology, infrared technology, sound wave technology or the like.

Figure 7:
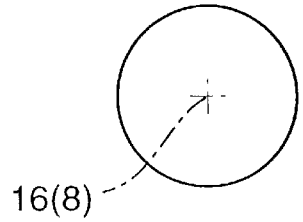
FIG. 7 is a representation corresponding to that of FIG. 5 of the field of vision of one of the video cameras once the mark of the printing plate has been brought into coincidence with the corresponding setpoint in the video camera.
Figure 8:
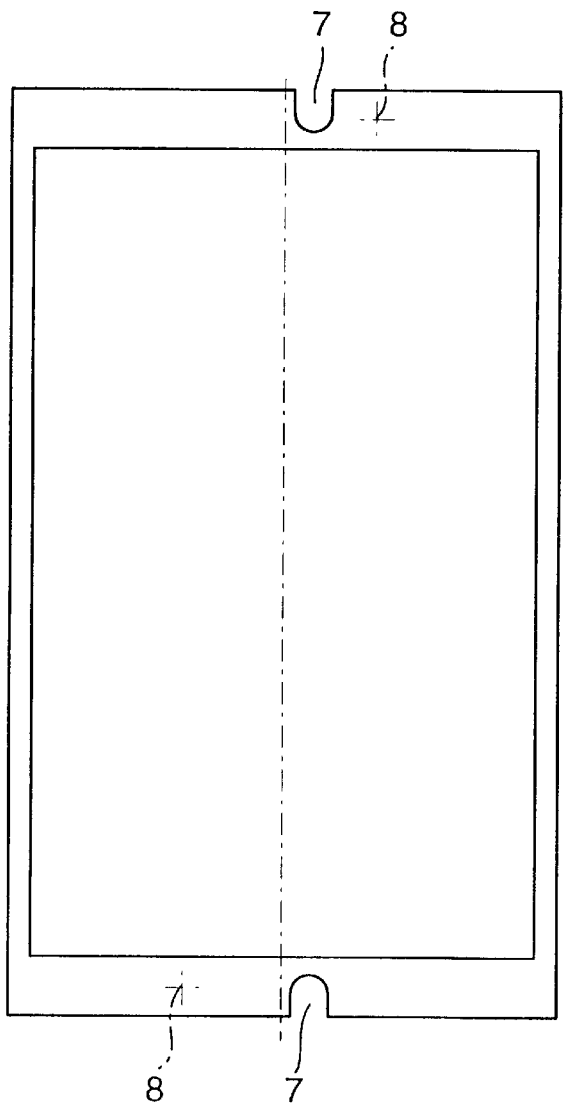
FIG. 8 is a representation corresponding to that of FIG. 4 of a printing plate in which the stampings are displaced in relation to the exact arrangement in FIG. 4 so as to allow for a paper error at the location of a printing roll at which this printing plate is to be mounted, again showing next to the stampings the marks or register crosses for cooperating with the correspondingly adjusted video camera.
Figure 9:
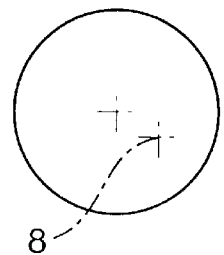
FIG. 9 is the field of vision of the video camera with the central register cross of the zero position in the video system and, displaced in relation thereto, the off-center register cross as mark of the printing plate which has been pre-aligned but not yet accurately adjusted.
Figure 10:
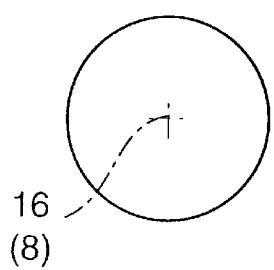
FIG. 10 is a representation corresponding to that of FIG. 7, in which the two marks of FIG. 9 coincide.
Figure 11:
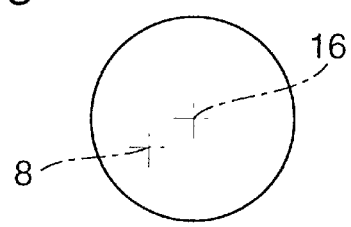
FIG. 11 is the field of vision of the video camera after a correction to allow for the paper error and FIG. 12 is a scheme for the empirical determination of paper errors or deformation, i.e. fan-out data, for a computer controlling the stamping and/or bending machine and its positioning device.

FIG. 8 depicts a printing plate 4 in which the stampings 7 are offset in relation to the zero position by a paper error. For so doing, the printing plate 4 is initially pre-aligned in the stamping and/or bending machine according to FIG. 9. After that, it is first exactly aligned according to FIG. 10 and then, by allowing—in a manner yet to be described—for the paper error later to be expected at this printing plate 4, it is moved in such a way as to obtain a shifted position of the mark 8 in relation to the central mark of the video system, as is depicted in FIG. 11. If the deformations are then applied to the printing plate 4, the stampings 7 to be seen in FIG. 3 are formed, which are offset in relation to the zero position proper. The printing plate 4 would be suited, by way of example, for the last printing roll of FIG. 1 in the direction of feed. FIGS. 2 and 3 show that the printing plates 4 are aligned in the stamping and/or bending machine 5 with the aid of at least two video cameras 9. As already mentioned, the video cameras 9 detect the marks 8 and the video cameras 9 and the printing plates 4 are adjustable, so that either an exact adjustment of the printing plate 4 according to the zero position is possible, as is indicated in FIGS. 7 and 10, or allowance can be made for the paper deformation to be expected, for example according to FIG. 11.

It becomes clear by reference to FIG. 1 that the paper deformation occuring in the course of the printing process differs at the individual printing rolls 1, e.g. increases from printing roll to printing roll, but also has different effects on the individual printing rolls. It is evident that in the center of the paper web a paper deformation is less pronounced than at the areas neighbouring the outer edges 3a.

Figure 12:
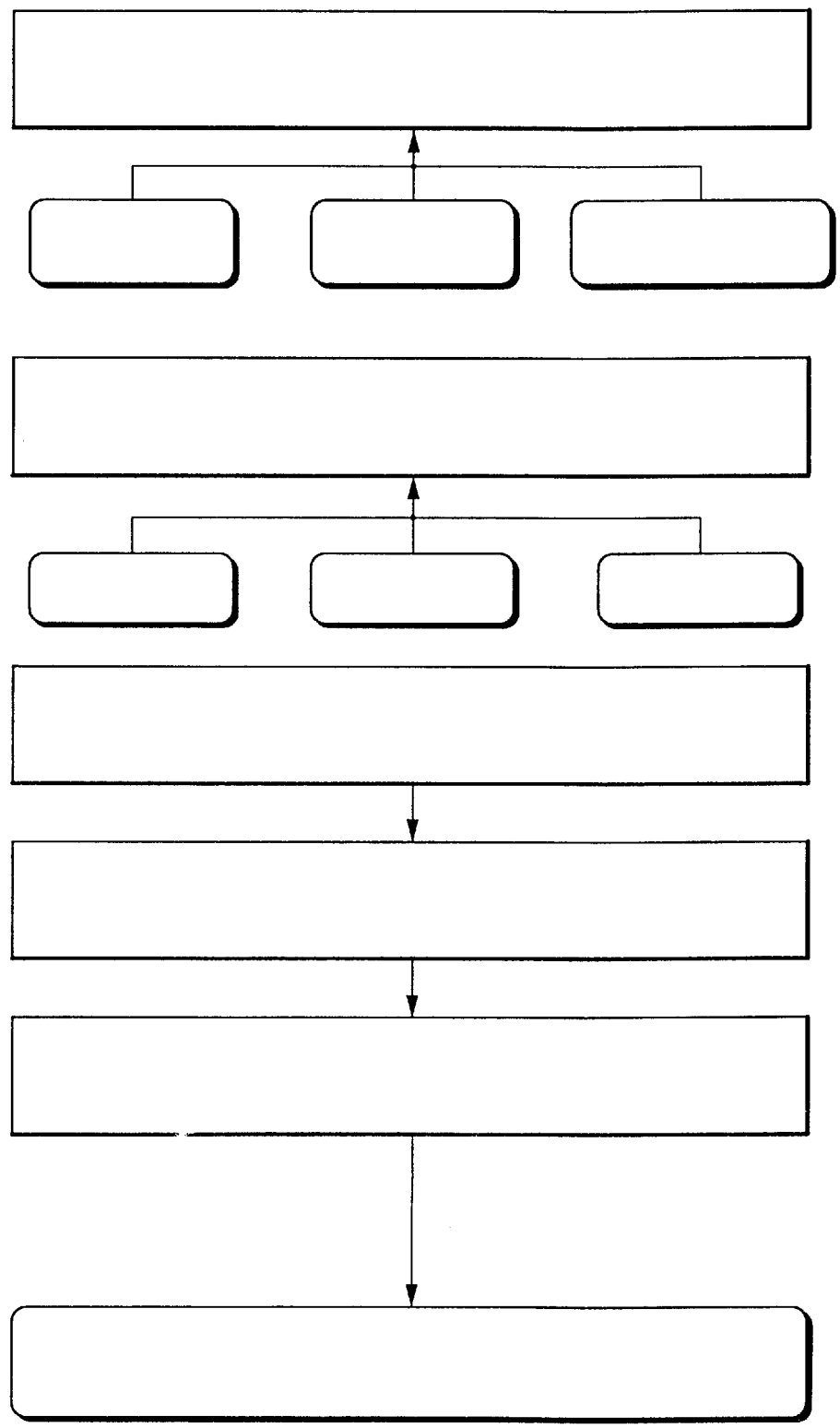

It is therefore proposed that for each location of the printing rolls 1 of a printing machine having a plurality of printing rolls 1, the paper deformation occuring there is empirically determined for the respective printing process and the respective grade of paper. That is to say, specimen prints are made and the measurements are checked or the specimen prints are made on millimeter-ruled paper so as to be able to immediately determine and measure, from printing roll to printing roll, the deviations of the individual prints from one another brought about by the paper deformations. These empirically determined values, which depend on the printing machine itself, the printing rolls 1, the paper used and also the printing inks used and the like, are fed into a computer (not shown) belonging to the stamping and/or bending machine 5. The computer can then control the mount 6 already mentioned for the printing plate 4 and, when called, can suitably move and adjust the respective inserted printing plate 4 before the deformation, i.e. bending and stamping 7, is applied thereto. FIG. 12 is a schematic representation of how the data for allowing for the paper deformation, i.e. fan-out, are determined or defined. It follows that first the type of printing machine is considered, namely with respect to the number of printing units, i.e. pairs of printing rolls, the position of the printing units and the printing plate capacity of the individual printing rolls or cylinders.

In addition, the grade of paper used is, of course, of great significance for the paper deformation, namely in respect of the substance, the actual material and also the format.

Further factors may include particularly the paper manufacturer and, as for the rest, the paper guidance and the mode of production of the paper. All these individual data and characteristics are hence to be heeded in the empirical determination of the paper deformation and to be entered as corresponding data into the computer, so that then with the respective printing machine correct allowance for a paper deformation can be made from the outset, more or less automatically and consistently, at the stamping and/or bending machine, depending on grade of paper and paper manufacturer.

It is known that occasionally a paper web 2 tears during the printing process and then the one or other printing roll is subjected to additional stress by paper winding round it several times. This is liable to lead to deformations in the region of the printing plate mounts, requiring correction for continued printing. It is possible in this connection for dimensional changes brought about by deformations at the fixing device of a printing roll 1 for printing plates 4 to be entered into the computer controlling the mount for the printing plate, such entry being effected the same way as is done in the above-described fashion with the changes to be expected in the dimensions of the paper web, so that the printing plate 4 to be newly produced after such a deformation of the printing roll 1 is bent and/or stamped in a fashion shifted or corrected by the extent of this deformation. Hence such deformations or damage can also be corrected very quickly and unproblematically for the further printing operations.

FIGS. 2 and 3 depict in schematic form the stamping and/or bending machine 5, already mentioned several times, for applying the deformations, that is, for example the stampings 7 for the register pins of printing rolls 1 on the printing plates 4 and/or for peripheral bends for mounting the printing plate 4 on the printing roll 1. FIG. 2 shows a basic frame 10 of the machine generally designated 5. In a manner known per se, the basic frame 10 carries a support known per se in the form of a supporting plate 11 and particularly also the bending tools 12, holding-down devices 13, bending punches 14 and stamping units 15. In addition, particularly FIG. 3 shows that two video cameras 9 are provided for alignment to the marks 8, the cameras in turn including corresponding marks 16, as is indicated in FIGS. 5 and 7 as well as 9 to 11. The function of the marks 8 and their co-operation with the mark 16 of the video cameras 9 was already mentioned. In the case of a normal stamping of a printing plate 4 according to FIG. 4, the two marks 8 and 16 are brought into coincidence according to FIG. 7 after previously having been brought only into each other's proximity as per FIG. 5 by a preadjustment of the printing plate 4.

For deliberately allowing for the paper error, however, according to FIG. 11 the mark 8 is then moved again in relation to the mark 16 by the paper error to be expected, so as to depart from the initially accurate adjusted position of FIG. 10.

Figure 6:
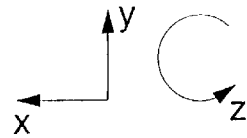
FIG. 6 shows the various aligning movements for the printing plate in two directions X and Y at right angles to each other and in the direction of rotation Z.

For this purpose, the machine mount 6 including the support plate 11 has a positioning device 17 with which the printing plate 4 it grips is movable in the printing plate plane in one or in two directions at right angles to each other, according to FIG. 6 in the X direction and Y direction, and is also rotatable in the Z direction according to the arrow curved in a circle. The two video cameras 9 are also movable and are manually adjusted for positioning with respect the marks 8 in the form of register crosses on the respective printing plate 4, after which this setting is preserved throughout the further working operation.

The positioning device 17 has a rotary disc 18 whose surface is arranged approximately flush with the support plate 11 of the mount 6 of the machine 5 in a recess 19 of this support plate 11. This can also be realized by the support plate 11 being composed of two suitably spaced individual plates.

The rotary disc 18 is rotatable within the recess 19 or clearance and is also movable in the horizontal direction, so that a printing plate resting and fastened on it can be adjusted accordingly, whereby the positioning device 17 is controlled by the computer already mentioned, so that the entry of the fan-out data into the computer leads to the printing plate 4 being adjusted according to the paper error to be expected and then provided with its deformations which allow for this paper error.

In an advantageous way, the individual printing plates 4 are hence mounted on the locations allocated to them of the printing rolls 1 in a position possibly somewhat offset and rotated in relation to the zero position. By this means, the fan-out of the paper to be expected at this respective location of the printing roll during the printing process is allowed for from the outset, avoiding laborious repositioning of the printing plates (4) relative to the printing rolls (1) after a correspondingly large number of specimen prints.

In the process and the device for adaptation of the position of printing plates 4 to the deformation (fan-out) of the paper web 2 to be printed through damp, ink absorption and mechanical stress on passing between several successive pairs of printing rolls 1 and also for adaptation to deformations possibly occuring in the fixing device of a printing roll 1 and resultant changes in the position of a printing plate 4, the printing plate 4 and/or the mount holding it in the stamping or bending machine 5 is moved or shifted laterally, in the circumferential direction and/or angularly by the amount required for the printing plate 4 on the printing roll 1 due to said deformation of the paper web 2 to be printed, so as to obtain a print corresponding with a preceding printing roll 1, as considered in the direction of feed of the paper web 2, despite the paper deformation that has meanwhile occured. Thereafter the deformations, i.e. bends and/or stampings 7, are applied to said printing plate 4 moved from its zero position. For this purpose in particular a computer-controlled positioning device 17 is used in the printing and/or stamping machine 5 after the corresponding data on the paper web, the printing machine and the type of production have been fed into the computer.

I claim:

1. A process for adjusting a position of printing plates for fan out of paper to be printed due to moisture and ink absorption on passing between successive pairs of printing rolls and/or for deformations occurring during attachment of the printing plates to a fixing device of a print roll, comprising:

providing a printing plate having marks on the printing plate for positionally accurate stamping and/or bending of the printing plate for placement on a print roll;

inserting the printing plate into a movable mount of a stamping and/or bending machine;

adjusting and aligning the printing plate in the stamping and/or bending machine according to the marks to a zero position;

moving the printing plate laterally, in a circumferential direction and/or angularly from the zero position by an adjustment amount required for positioning the printing plate on the printing roll which accounts for fan out of the paper web to be printed in order to obtain a print corresponding with a preceding print roll in a paper feed direction despite the paper fan out; and applying deformations in a form of a bend and/or stamping to the printing plate at the adjusted position.

2. A process as claimed in claim 1, wherein the aligning of the printing plate in the stamping and/or bending machine is aided by providing at least one measuring device comprising at least one of an optoelectronic, laser, infrared, sound wave, ultrasonic wave and chemical reaction measuring device; and detecting the marks on the printing plate using the measuring device.

3. A process as claimed in claim 1 wherein the process further includes:

empirically determining data for the fan out for each location of one or more rolls of a printing machine having a plurality of printing rolls for a determined printing process and grade of paper;

supplying the empirically determined data to a computer in the stamping and/or bending machine which controls the mount; and moving and adjusting the inserted printing plate to the adjusted position using the computer before stamping and/or bending via the controllable mount before deformations are applied.

4. A process is claimed in claim 1 wherein the process further includes:

entering data containing dimensional changes brought about by deformations at a fixing device of a printing roll for the printing plates into a computer which controls the mount of the printing plate; and adjusting the position of the printing plate based on the data on the fixing device deformations such that the printing plate is bent and/or stamped in a corrected location based on the data on the fixing device deformations.

5. A process according to claim 1, further comprising;

providing a stamping and/or bending machine adapted to apply the stamping to the printing plate for registration pins of a printing roll, the stamping and/or bending machine including the controllable mount which is adapted to receive the printing plate, the mount including a positioning device for moving the printing plate in at least one of two directions located at right angles to each other and rotatably, and at least two video cameras for detecting the marks on the printing plate.

6. The process of claim 5, wherein the positioning device comprises a rotary disk having a surface arranged approximately flush with a support of the mount, the rotary disk being located in a recess in the mount and being rotatable within the recess and adjustable in a horizontal direction in at least one of two directions located at right angles to one another.

\* \* \* \* \*